(12) United States Patent
Holzapfel et al.

(10) Patent No.: US 6,603,114 B1
(45) Date of Patent: *Aug. 5, 2003

(54) SCANNING HEAD COMPRISING A SEMICONDUCTOR SUBSTRATE WITH A BLIND HOLE CONTAINING A LIGHT SOURCE (75) Inventors: Wolfgang Holzapfel, Obing (DE); Elmar Mayer, Nussdorf (DE)

(73) Assignee: Johannes Heidenhain GmbH, Traunreut (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/471,454

(22) Filed: Dec. 23, 1999

(30) Foreign Application Priority Data

Dec. 23, 1998 (DE) .......................... 198 59 670

(51) Int. Cl.$^7$ ................................ G01D 5/34
(52) U.S. Cl. .................. 250/231.14; 250/237 R; 356/617
(58) Field of Search ........... 250/231.13, 231.14, 250/231.16, 231.17, 231.18, 237 R; 356/616, 617; 341/13, 31, 11

(56) References Cited

U.S. PATENT DOCUMENTS

| | | | |
|---|---|---|---|
| 5,155,355 A | | 10/1992 | Kabaya |
| 5,283,434 A | * | 2/1994 | Ishizuka et al. ........ 250/237 G |
| 5,534,693 A | | 7/1996 | Kondo et al. |
| 5,604,345 A | | 2/1997 | Matsuura |
| 5,666,196 A | | 9/1997 | Ishii et al. |
| 5,995,229 A | * | 11/1999 | Omi ..................... 356/616 |
| 6,043,482 A | * | 3/2000 | Hagl et al. ............ 250/231.13 |

FOREIGN PATENT DOCUMENTS

| | | |
|---|---|---|
| DE | 25 11 350 | 10/1975 |
| DE | 40 91 517 | 8/1991 |
| DE | 40 06 789 | 9/1991 |
| DE | 42 09 149 | 11/1992 |
| DE | 44 25 636 | 2/1996 |
| DE | 197 01 941 | 7/1997 |
| DE | 43 23 712 | 12/1997 |
| DE | 197 20 300 | 12/1997 |
| EP | 0 543 513 | 10/1992 |
| EP | 0 720 005 | 7/1997 |
| GB | 1 504 691 | 3/1974 |
| WO | 99/08074 | 2/1999 |

* cited by examiner

Primary Examiner—Stephone B. Allen
Assistant Examiner—Eric Spears
(74) Attorney, Agent, or Firm—Kenyon & Kenyon (57) ABSTRACT A scanning head is described, having on a side facing a scale at least one patterned photodetector, which is realized in a semiconductor substrate. The semiconductor substrate has an anisotropic blind hole that is symmetrical to the several photodetectors, and a light source arranged on a base plate in the blind hole. The transmitting grating for the light source is formed either in a metallization layer on the semiconductor substrate or, in the form of bars of the semiconductor substrate that have not been etched away. The distance between the scale and the transmitting grating as well as the distances between the scale and the patterned photodetector are essentially the same.

28 Claims, 6 Drawing Sheets

SCANNING HEAD COMPRISING A SEMICONDUCTOR SUBSTRATE WITH A BLIND HOLE CONTAINING A LIGHT SOURCE

The invention concerns a scanning head for a measuring system and a method for manufacturing and using the scanning head.

DESCRIPTION OF RELATED ART

British Patent 1,504,691 and a corresponding German Patent Application 25 11 350 A1 describe a measuring system in which the displacement of a first assembly is measured relative to a second assembly. Two gratings are provided which are at a constant distance from each other, each of which being secured to one assembly. If the second grating receives divergent light from a light source, the first grating generates a periodic image of the second grating, this image being in motion if there is relative motion between the two assemblies. Furthermore, photodetectors are provided which have a periodic pattern and are fixedly connected to the second assembly. The first grating is a reflecting grating, and the second grating and the photodetectors are located essentially in one plane. The light source and the second grating can also be replaced by a patterned light source that generates the same image as a conventional light source and a grating. The periodic photo detectors interact with the image such that a periodic modification of the output signal of the photodetectors arises if a relative motion occurs between the first and the second assembly.

One disadvantage of the system is that it is not disclosed how the described system is to be realized. In addition, it is disadvantageous that the photoelements are always arranged on the side next to the light source, resulting in an increased sensitivity to tilting on the part of the scanning head. Furthermore, is not clear from this publication that the second grating and the patterned photo detector are placed at the same distance from the first grating, to make possible an optically optimal imaging. This apparatus is also very difficult to manufacture.

German Patent Application 197 01 941 A1, describes a scanning grating arranged on the side of a transparent carrier that is facing a scale. The scanning grating receives light from a light source such that an image of the grating is projected onto the scale. On the scale, there is located a second grating, which reflects the image onto a patterned photodetector. The transparent carrier for the first grating is bonded to the semiconductor material in which the patterned photodetector is realized, such that the scanning grating and the photodetector are staggered in the measuring direction with respect to each other, although they are at the same distance from the scale. In a second specific embodiment of German Patent Application 197 01 941 A1, the scanning grating is arranged on the side of the transparent carrier that is facing away from the scale. On the same side as the scanning grating, an optical chip is arranged on the same transparent carrier that contains the photodetector. These arrangements also assure that the scanning grating and the patterned photodetector are approximately the same distance from the scale.

In the first specific embodiment, a disadvantage arises because the transparent carrier on which the scanning grating is applied has to be bonded to the semiconductor material in which the patterned photodetector is realized. This bond must be effected very precisely so that the pattern of the photodetector is aligned parallel to the grating and the pattern and grating are the same distance from the scale. This precise bonding between carrier and semiconductor material is therefore very difficult to realize. Furthermore, the second specific embodiment has the disadvantage that an optical chip has to be secured on the transparent carrier. As a result of mounting it using chip-on-glass technology, there inevitably arises a gap between the optical chip and the carrier, as a result of which the distances between the scanning grating and the scale and between the photodetector and the scale significantly diverge from each other, which leads to a marked deterioration of the optical properties of the apparatus.

German Patent 40 91 517 T1, describes making a scanning head for a measuring system from one single block of semiconductor material. Provision is made on the surface of a planar light-emitting diode for photoelements that are configured as grating lines, through which the light from the light-emitting diode cannot penetrate. As a result, there arises a patterned photodetector, over and under which a patterned light source is arranged. As a result, the pattern of the light source and the patterned photoelements are made to have the same distance from the scale.

The scanning head, however, has the disadvantage that the photodetector pattern receives divergent light directly from the light source, and as a result a high background signal level arises in the photoelements. This is unavoidable even if the photoelements are protected on the reverse side by a metallic layer, since the edges of the photoelements are also sensitive. A further disadvantage is that the photoelements have to be applied to a carrier substrate as thin layers, in a very cumbersome process that usually does not result in high quality photoelements.

PCT/European Patent 98-04658 of the applicant describes a measuring device that, in addition to periodic incremental signals, also delivers at least one reference pulse signal, given a defined reference position of a scale and a scanning unit that is movable in relation thereto. On the scale, at least one reference marking field is arranged so as to be integrated into an incremental graduation, and the scanning unit includes a detector apparatus that has, in the measuring direction, at least three active detector areas, arranged so as to be adjoining. Two of the detector areas are used as reference pulse signal detectors and generate a reference pulse signal, the relative location of the reference pulse signal detectors in the measuring direction depending on the pattern of the reference marking field on the scale. A detector arranged between the reference pulse signal detectors functions to generate at least one incremental signal. In addition, provision is made for various measures for filtering the incremental signal component from the reference pulse signal.

German Patent Application 197 20 300 A1 describes an electronic hybrid component in which, in a chip-on-chip arrangement, an implanted chip is arranged on a carrier substrate. The carrier substrate has at least one cavity, in which is located an electrical insulating layer having a metallic layer on top of it. The chip that is implanted in the cavity is contacted to the metallic layer, as a result of which the latter is used as an electrical lead. If the implanted chip is a light-emitting diode, the metallization layer can also be used for the purpose of reflecting its light beam on the walls of the cavity.

This apparatus has the disadvantage that both the beam direction of the light-emitting diode as well as its electrical contacts are arranged on one side of the semiconductor substrate or are emitted on this one side.

European Patent 543 513 A1, describes both a patterned photodetector as well as a patterned light source in the form of at least one light-emitting diode of a scanning head, formed on a common semiconductor substrate made of III/IV semiconductor material, such as gallium arsenide Ga-As. By forming the patterned light source and the patterned photodetector on a common semiconductor material, the design satisfies the requirement that the transmitting and receiving pattern be formed in one plane. Furthermore, a single-field scanning takes place, in which the photoelements are offset by $\alpha+k^* 360°$, where k is a whole number and $\alpha$ is preferably 90°, 270°, 120°, or 240°. Therefore, a plurality of photoelements is arranged staggered in the measuring direction, with respect to each other, by 90 degrees of angle plus a whole-number multiple of 360 degrees of angle. In this way, the scanning becomes particularly immune to interference.

One disadvantage of this design is that no account is given as to how the patterned photodetector and the patterned light source are to be manufactured on a common semiconductor material made of Ga-As. If the technologies of semiconductor production known from the related art are used, then this manufacturing process is very cumbersome and thus expensive, since thick epitaxial layers having varying aluminum concentrations must be applied next to each other, by being pattern-imprinted onto the semiconductor substrate. Only in this way can the emission wavelength of the light-emitting diode be shifted with respect to the absorption edge of the photoelements such that significant signal currents can be generated.

SUMMARY OF THE INVENTION

There is thus a need for a scanning head and a method for manufacturing it, in which transmitting and receiving gratings and patterned transmitting and receiving assemblies provided on the scanning head are at an identical distance from the scale, and where the transmitting grating can be arranged in the center with respect to the receiving gratings. In addition, single-field scanning is to be used. The manufacturing process for the scanning head should be also cost-effective. The scanning head of this type is to be used especially in angle and in length measuring systems.

In one aspect, the invention is a scanning head for scanning a scale which carries a graduation, where the scanning head includes a semiconductor substrate having a first side facing the scale, a plurality of patterned photodetectors disposed on the first side, and a blind hole formed in the semiconductor substrate. The device also includes a transmitting grating disposed on the first side facing the scale, said transmitting grating being symmetrically aligned with respect to the patterned photodetectors, and a light source disposed on a side of the transmitting grating facing away from the scale.

In another aspect, the invention is a method for manufacturing a scanning head for scanning a scale which carries a graduation, including the steps of diffusing pn-junctions into a first surface of a semiconductor substrate facing the scale, to form photo diodes, generating an oxide layer on the first surface of the semiconductor substrate, and etching with an anisotropic etching process down to the oxide layer a second surface of the semiconductor substrate adjacent to the photo diodes, the second surface facing away from the scale.

The apparatus according to the invention has the advantage that the pattern and the receiving grating for the photodetector, as well as the pattern and the transmitting grating for the light source, are disposed at substantially the same distance from the scale to be scanned. In this way, optimal optical properties of the scanning head can be assured. Furthermore, it is advantageous that the patterns and gratings are produced in method steps which are well-known from semiconductor technology. In this way, they can be executed very precisely and very cost-effectively, with only little wastage. A further advantage rests in the fact that the photodetectors and the light-emitting diode used as the light source can be manufactured from different semiconductor materials. It is particularly advantageous that the scanning head according to the invention can be used in precision measuring systems for angle and length measuring, systems that are used preferably in numerically controlled machines.

BRIEF DESCRIPTION OF THE DRAWINGS

Details of the invention are explained in greater detail below on the basis of the specific embodiments depicted in the drawings. In the Drawings.

DETAILED DESCRIPTION OF PREFERRED EMBODIMENTS OF THE INVENTION

The scanning head according to the invention is explained below on the basis of exemplary embodiments used with a length measuring system. However, the possibility exists of also using the scanning head according to the invention in an angle measuring system or in a two-dimensional measuring system, without significant modifications.

Figure 1:
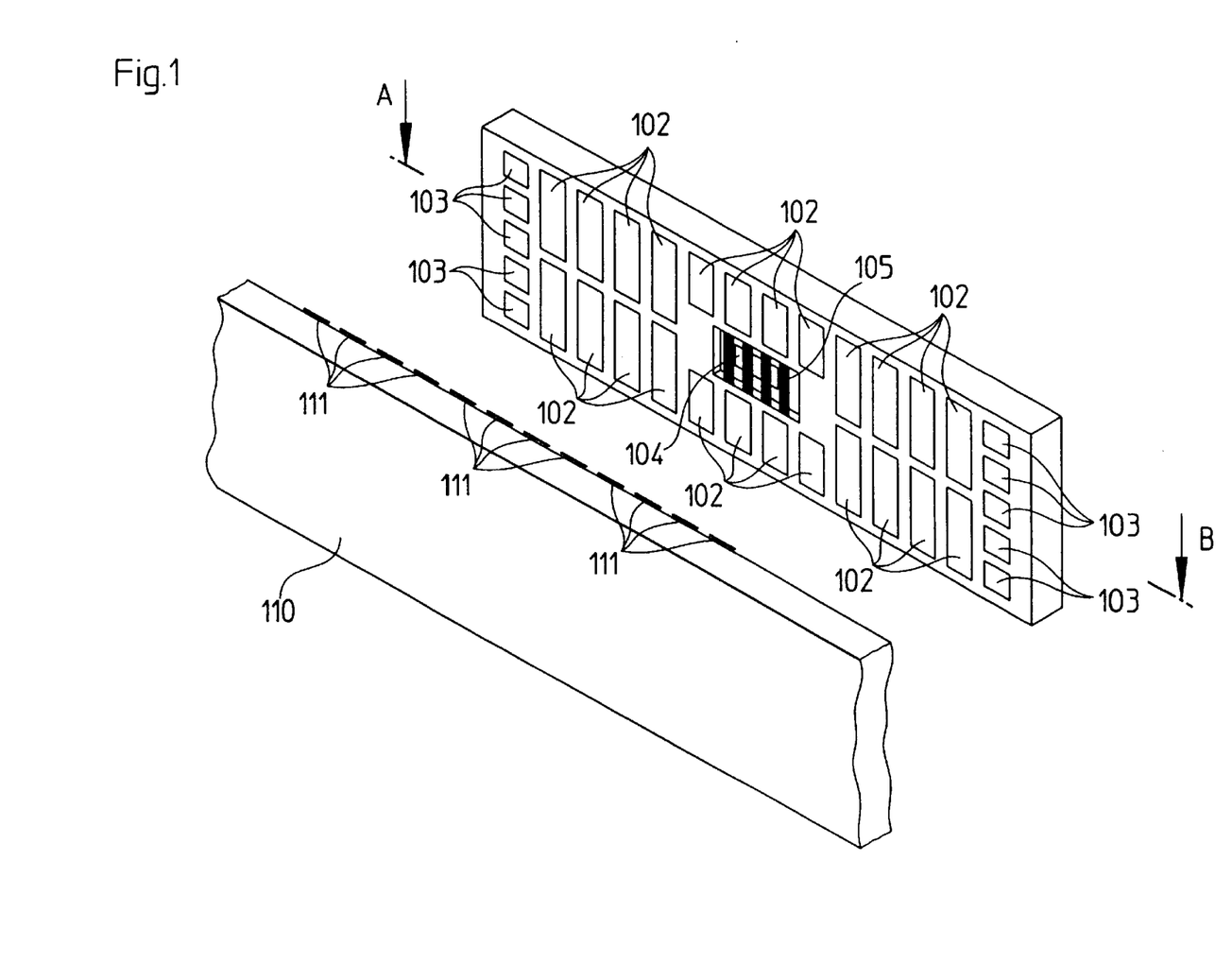
FIG. 1 shows a perspective view of the scanning head and a scale according to the invention.

FIG. 1 shows a preferred embodiment of scanning head 101 according to the invention, having associated scale 110. Scanning head 101 has photodetectors 102, using which single-field scanning of graduation 111 of scale 110 is made possible. Photodetectors 102 are arranged on the scanning head so as to be staggered in the measuring direction by $\Pi/2$ plus a whole-number multiple of 2 $\Pi$, and the number of photodetectors 102 in each row is selected as a whole-number multiple of four. In this manner, it is assured that an entire period of the receiving signal is detected. Photodetectors 102 are arranged on the scanning head in an upper and a lower row, whose output signals are also linked to each other such that fluctuations in their output signals, for example due to a tilting of the scanning head, are compensated for.

Photodetectors 102 have a pattern, not depicted in FIG. 1, which is realized by the grating arranged over photodetectors 102 when individual photodetectors 102 are formed by a single pn-junction. The pattern can be also obtained by patterning photodetectors 102 themselves, if a plurality of pn-junctions are interconnected to each photodetector 102.

In the center of photodetectors 102, the semiconductor substrate is completely removed, which is possible using an anisotropic etching process or using ultrasonic drilling. At this location, provision is made for a light source, preferably formed by a light-emitting diode 104. This light-emitting diode 104 is preferably contacted on the reverse side of scanning head 101. Above light-emitting diode 104, at the level of the surface of photodetector 102, a transmitting grating 105 is arranged, so that a patterned light source is realized as a result of light source 104 and grating 105. At the edge of scanning head 101, provision is made for contacts 103, via which photodetectors 102 and, in one preferred embodiment, also light source 104 can be contacted. Since light-emitting diode 104 is not realized in the same semiconductor substrate as photodetectors 102, it is possible to use a different semiconductor material for light-emitting diode 104.

Figure 2:
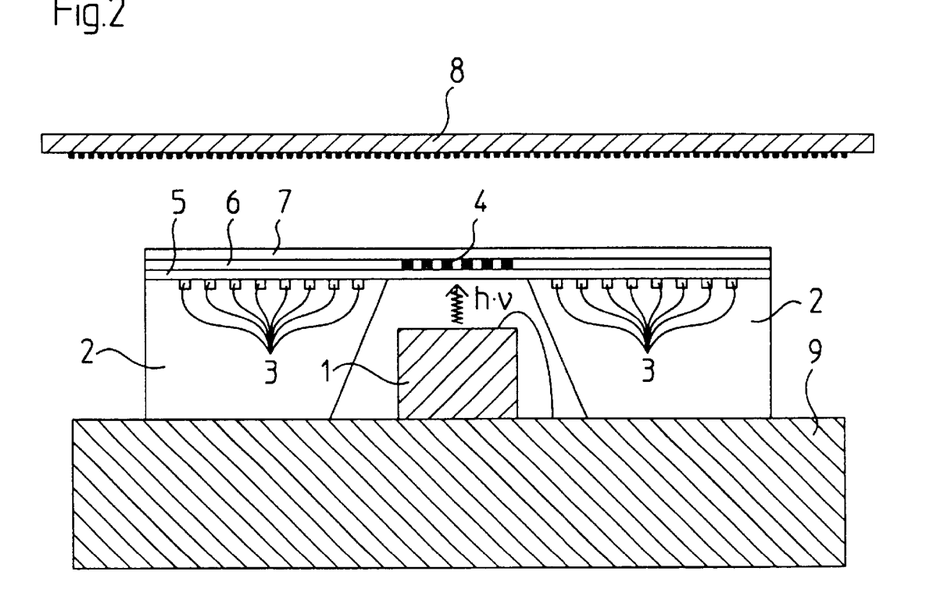
FIG. 2 shows a side elevation view of a section A–B of the scanning head according to the invention shown in FIG. 1.

In FIG. 2, a cross-section of an embodiment of a scanning head 101 according to the invention is depicted along line A–B shown in FIG. 1. A scanning head is arranged on a base plate, which can be a printed circuit board 9 of an electric circuit, Onto this printed circuit board 9, a light source is soldered in the form of a light-emitting diode 1, which is supplied with voltage via printed circuit board 9. Light-emitting diode 1 is realized as a separate circuit, so that its semiconductor material does not have to be the same as that of the scanning head. Light-emitting diode 1 can have contacts to printed circuit board 9 using flip-chip technology. Alternatively light-emitting diode 1 can also be connected to the printed circuit board by a bond. Also located on printed circuit board 9 is semiconductor substrate 2, for which silicon is preferably used. At the location where light-emitting diode 1 is provided, the semiconductor substrate has been completely etched through, so that light-emitting diode 1 can project a beam. In this context, the side walls of this blind hole are slightly inclined, as a result of which they function as a light guide. As a result, the beam from light-emitting diode 1 can be focused on the transmitting grating.

On the side of semiconductor substrate 2 that is facing scale 8, provision is made for a plurality of photo diodes 3, which have a longitudinal shape perpendicular to the measuring direction. Photo diodes 3 are generally connected to a plurality of photodetectors and their pattern results from the shape of photo diodes 3. The distance between two photo diodes 3 of a photodetector must correspond to the grating constant of the receiving grating, as would be required in a conventional design. The pattern of photo diodes 3, performs the function of the grating, which in this design can be dispensed with. A plurality of photo diodes 3 is connected to one photodetector. The photodetectors have a separation of Π/2 plus a whole-number multiple of 2 Π with respect to the period of the receiving pattern, and are therefore connected to each other in a finger-like manner. This enables a particularly advantageous single-field scanning of scale 8 to be attained. It is also possible, however, to realize a single-field scanning using separations other than Π/2. Photo diodes 3 are disposed a specific distance from a blind hole, through which the light of light-emitting diode 1 shines. In this manner, the light of light-emitting diode 1 when striking the semiconductor substrate in this area cannot induce a current in photo diodes 3.

On the side of the semiconductor substrate facing scale 8, provision is made for an oxide layer 5 made of silicon dioxide, which is transparent to light. Above it, a metallization layer 6 can be disposed, which in the area of the blind hole of semiconductor substrate 2 contains transmitting grating 4. In this transmitting grating 6, a patterning of the light emitted by light-emitting diode 1 takes place, after the light has penetrated through the optical orifice of the blind hole. Above metallization layer 6, provision is made for a passivation layer 7. All layers 5 and 7 are transparent to the beam emitted by light-emitting diode 1.

Metallization layer 6 can also be used to contact the photodetectors and to realize a transmitting and/or receiving grating, in the event that the patterning of the photo diodes cannot be otherwise formed sufficiently finely. Metallization layer 6, when used in this manner, is not transparent.

The light patterned in transmitting grating 4 subsequently encounters scale 8, by whose graduation it is partially reflected to photo diodes 3. A striped image is formed at the location of the photodetectors, as a result of the interaction of the light beam, the transmitting grating, and the scale. A relative displacement between scanning head and scale 8 causes a sinusoidally alternating light intensity to arise at photo diodes 3, due to the reflection on scale 8, which causes a periodic change in the light intensity leading to a sinusoidally alternating photo current. The alternating current travels from photo diodes 3 to an evaluation circuit, which measures the value of the displacement therefrom.

The scanning process can be carried out in two known manners. The two possibilities that exist are referred to as geometric image and diffraction image. The optical composition of these images differs principally in the selection of the scale grating. In the geometric image, the scale grating is executed as an amplitude grating, whose grating constant is twice as large as that of the transmitting grating. Alternatively, the amplitude grating can also be replaced by a phase grating having a phase deviation of 90°, given an unchanged grating constant. In the diffraction image, the scale grating is preferably executed as a phase grating having a phase deviation of 180°, the grating constant being identical to that of the transmitting grating. Both in the geometric image as well as in the diffraction image, the grating constants of the transmitting and receiving gratings are identical. For all scanning variants, there are typical dependencies of signal modulation on scanning distance, such as are described in the related art. Accordingly, a favorable scanning distance can be selected using those methods.

In principle, in the case of the above-mentioned variants the distances between transmitting grating and scale, as well as between the scale and the receiving grating, can be varyingly selected. However, the distance tolerances in the case of an incident-light sensor are significantly larger when the transmitting and receiving gratings are at the same distance from the scale. This requirement is all the more important the larger the effective surfaces of the transmitting and receiving gratings are. In practice, this means that both surfaces must be aligned to within about +/− 20 $\mu$m, but ideally within about +/− 5 $\mu$m.

The light striking the patterned photoelements is absorbed within a specific penetration depth, which is a function of the wavelength. Typical values are about 5 $\mu$m to 40 $\mu$m. This means that in a patterned photodetector, the effective distance to the scale is typically 2–20 $\mu$m greater than the distance of its surface to the scale. This can be taken into account using a grating constant of the receiving grating that is slightly larger in comparison to the transmitting grating. The sensor may have a limited distance tolerance, but it is more favorable to apply a receiving grating simultaneously above the patterned photodetector, the gap openings of the receiving grating being somewhat smaller than the width of the individual photo diodes situated below it. In this manner, the effective scanning plane is precisely set in the plane of the receiving grating, which in turn is precisely aligned with the transmitting grating. Since the divergent light beams already have significant angles of inclination at the larger parts of the receiving grating, the individual diodes below the gap openings are somewhat shifted to the outside with respect to the latter. This corresponds to a slightly large period of the patterned photo diode in comparison to the receiving grating.

Figure 3:
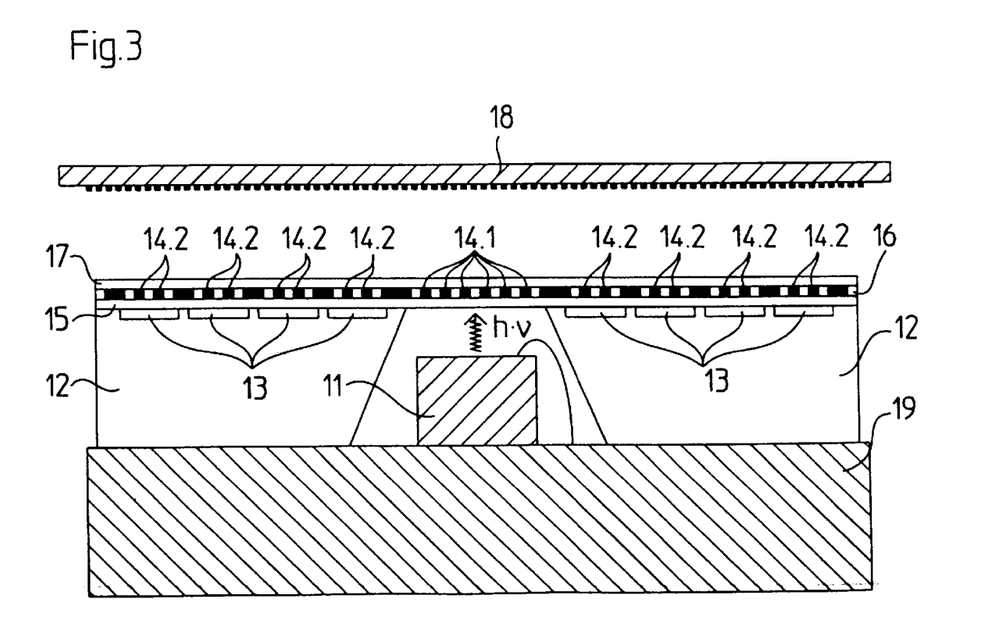
FIG. 3 shows a side elevation view of a second embodiment of the scanning head according to the invention.

In FIG. 3, a further embodiment of the detector according to the invention is depicted. In cases where the grating constant required for the receiving grating cannot be formed in the separate photo diodes, due to the necessary dimensions, provision can also be made for a supplemental receiving grating 14.2. FIG. 3 also shows a semiconductor substrate that is arranged on a base plate 19. This substrate has a blind hole, in which a light-emitting diode 11 is arranged as the light source. On the side of the semiconductor substrate facing scale 18, photo diodes 13 are arranged. The width of photo diodes 13, however, is larger than the grating constant of the required receiving grating. Therefore, in metallization layer 16, which is again located above transparent passivation layer 15, provision is made not only for a transmitting grating 14.1, but also for a receiving grating for photo diodes 13. Above metallization layer 16, a transparent passivation layer 17 is again arranged. In this embodiment, a photodetector is advantageously realized by a pn-junction. However, it is also possible that a plurality of pn-junctions can be connected to a photodetector. Receiving grating 14.2 can then be arranged for each photodetector to be shifted by Π/2 in the measuring direction.

The light emitted by light-emitting diode 11 is first patterned in transmitting grating 14.1, as in FIG. 2, and then strikes scale 18, being reflected partially by the scale's graduation to receiving grating 14.2. The variation in intensity of the light arising in the plane of receiving grating 14.2 is sensed by the pattern of the receiving grating, so that in the event of a relative motion between scale 18 and the scanning head, the intensity and thus the photo current fluctuates as a function of the relative displacement. The motion thus can be measured by evaluating the current.

Figure 4:
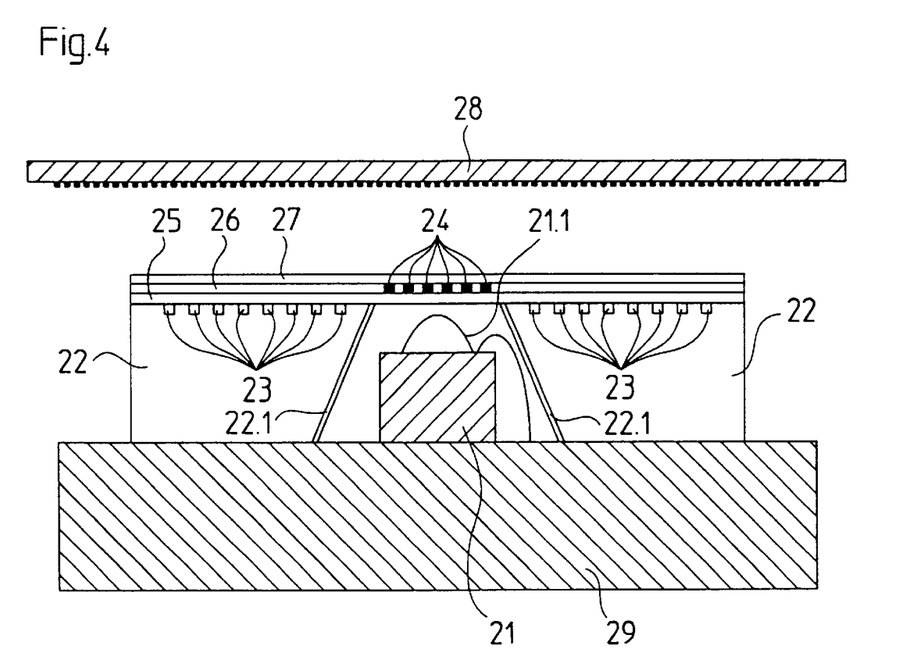
FIG. 4 shows a side elevation view of a third embodiment of the scanning head according to the invention.

In FIG. 4, a further advantageous embodiment of the scanning head according to the invention is depicted. In contrast to FIG. 2, this exemplary embodiment has an additional optical assembly 21.1 on light-emitting diode 21. This assembly focuses the light emitted by light-emitting diode 21 in the direction of transmitting grating 24. Furthermore, provision is made for a light-reflecting coating 22.1 of the side walls of the blind hole. As a result of these measures, light that has not been emitted by light-emitting diode 21 directly in the direction of transmitting grating 24 is prevented from creating in semiconductor material 22 electron-hole pairs, and thus a current which overlaps the current of photo diodes 23. As a result, the scanning head's signal to noise ratio can be improved.

Furthermore, it is possible to select a low-resistance semiconductor material 22, so that the recombination times of the electron-hole pairs generated by the light of light-emitting diode 21 are so small that no significant number of them can diffuse to photo diodes 23 and generate a faulty current.

Figure 5:
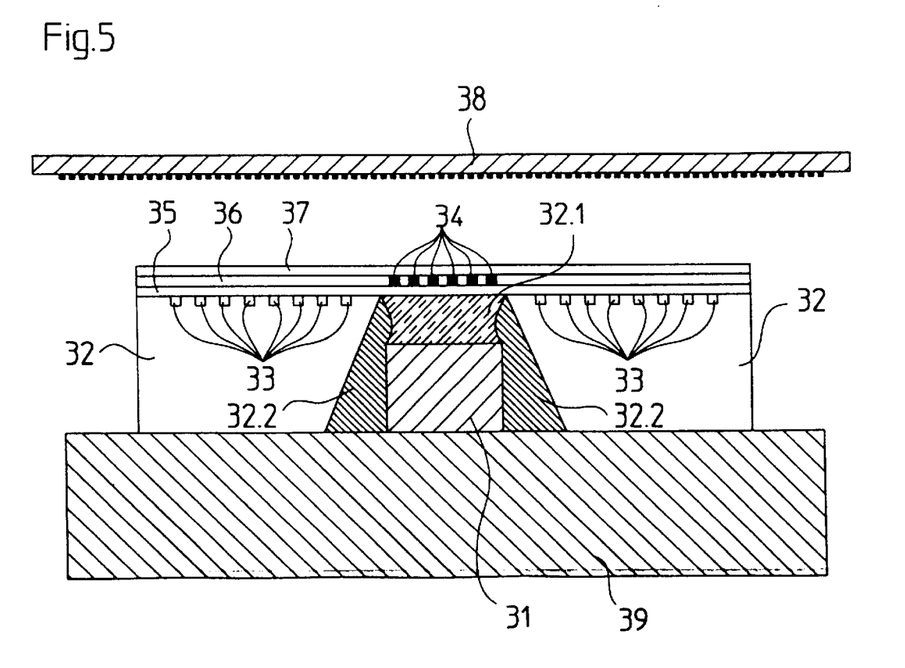
FIG. 5 shows a side elevation view of a fourth embodiment of the scanning head according to the invention.

A further measure to prevent interference currents from being caused by light-emitting diode 31 is depicted in FIG. 5. On a base plate 39, a semiconductor substrate 32 is arranged. The latter has a blind hole extending to oxide layer 35. On the side of the semiconductor substrate facing scale 38, provision is made for photo diodes 33. Light-emitting diode 31 is now bonded to oxide layer 35 using a soft, optically transparent adhesive, which instead of dispersing the light emitted by light-emitting diode 31 rather bundles it. Light-emitting diode 31 is connected to base plate 39 by electrical leads.

An opaque filler material 32.2 can be introduced into the space of the blind hole not filled after the adhesive process using adhesive 32.1, the filling material effecting an optical insulation between light-emitting diode 31 and semiconductor substrate 32. Only the light of light-emitting diode 31 that is partially reflected by the graduation of scale 38, and is patterned by transmitting grating 34, reaches photo diodes 33 of the semiconductor substrate. Layers 35, 36, and 37 are transparent, and no transmitting grating 34 is arranged in the optical path. This arrangement assures that only a very small amount of light is emitted directly into semiconductor substrate 32, leading to interference currents.

As an alternative to the leads between light-emitting diode 31 and printed circuit board 9, it is possible to remove oxide layer 35 between light-emitting diode 31 and transmitting grating 34. Further, using a conductive adhesive 32.1, it is possible to secure the contacts of light-emitting diode 31 for the voltage supply to transmitting grating 34, which is made of conductive material, or to a contact point of metallization layer 36. Transmitting grating 34 or the contact points with their supply leads are then used to supply voltage to light-emitting diode 31, so that the latter have supply leads outside of their optically relevant area.

Figure 6:
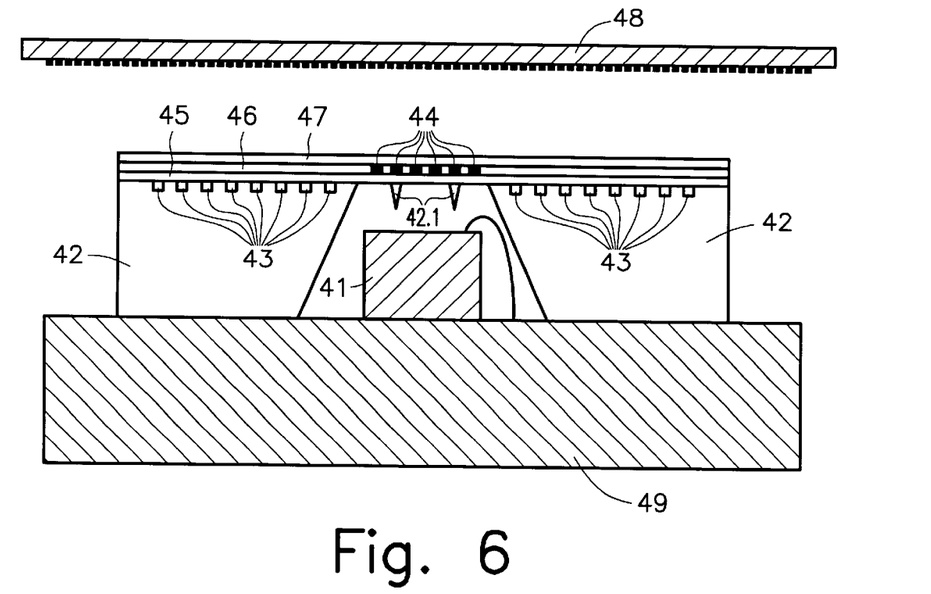
FIG. 6 shows a side elevation view of a fifth embodiment of the scanning head according to the invention.

An exemplary embodiment that is improved with respect to mechanical stability is depicted in FIG. 6. An optimal optical quality of the scanning head requires a substantially identical distance from transmitting grating 44 and patterned receiving diodes 43, to scale 48. For this purpose, oxide layer 45 must be executed so as to be very thin. This can be done using an approximately 1–3 μm thickness of oxide layer 45. However, the mechanical stability of oxide layer 45 decreases along with the capacity to also support transmitting grating 44, which is preferably made of aluminum bars that are used in semiconductors as electrical conductors.

To increase the mechanical stability without making oxide or passivation layers 45 and 47 significantly thicker, provision is now made for making bars 42.1 of the semiconductor material which remains after the etching process. These bars 42.1 are arranged between transmitting grating 44 and light-emitting diode 41, such that they do not alter the optical properties of the apparatus. The position, width, and orientation of bars 42.1 are selected such that their optical effect on the scanning signals remains minimal, apart from an unavoidable signal reduction.

The masking that is necessary for the configuration of bars 42.1 can advantageously be already contained in the masking for the reverse-side blind-hole etching, so that no further lithographic steps are necessary.

Figure 7:
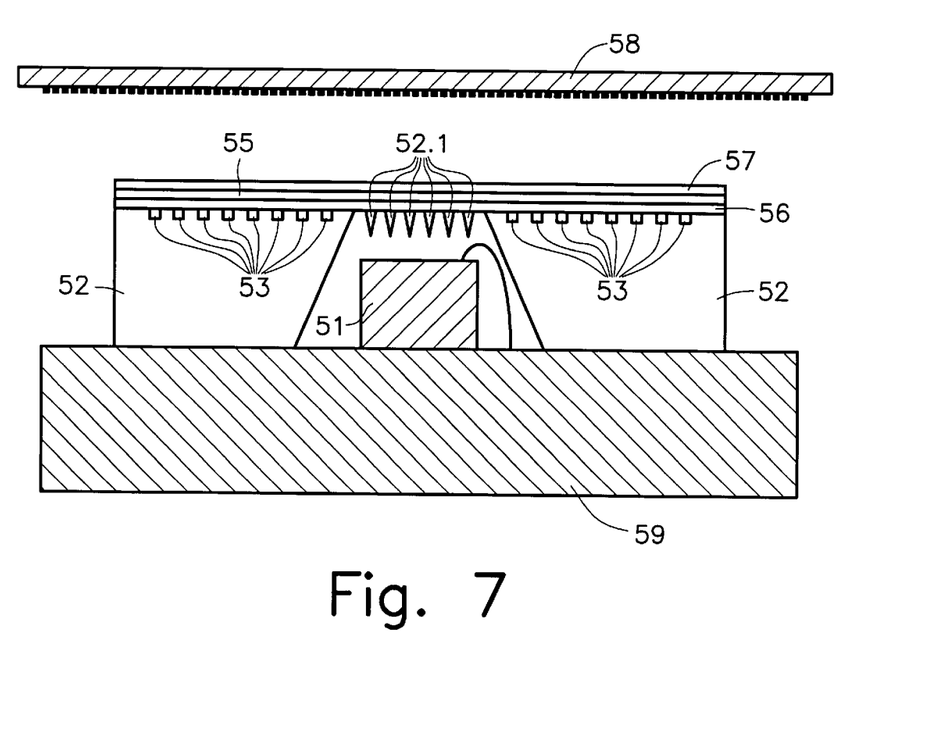
FIG. 7 shows a side elevation view of a sixth embodiment of the scanning head according to the invention.

In an advantageous refinement shown in FIG. 7, no complete blind hole of semiconductor substrate 52 is generated to create a path for the light emitted by light-emitting diode 51. Instead, on the side of semiconductor substrate 52 facing scale 58, the transmitting grating is realized using bar 52.1. As a result, it becomes unnecessary, in addition to a first oxide layer 55, to provide for a further metallization layer 56 for the transmitting grating and for a further passivation layer 57, as in the preceding exemplary embodiments. Bars 52.1, are left intact by the etching process at a distance derived from the desired grating constant for the transmitting grating. Next to the transmitting grating generated in this manner, patterned photo diodes 53 are again arranged so as to have the desired distance for the receiving grating, and they are connected to the photodetectors.

Light-emitting diode 51, arranged on base plate 59, shines in the direction of bars 52.1 that remain in the blind hole. The bars functioning as transmitting gratings for patterning the light. The patterned light is partially reflected at the graduation of scale 58 and strikes patterned photo diodes 53, where in accordance with a relative motion between scale 58 and the scanning head, an alternating current is generated.

This embodiment has the particular advantage that patterned photo diodes 53 and bars 52.1, remaining from the etching process, are precisely the same distance from scale 58, which makes possible an optimal optical quality of the apparatus.

Figure 8:
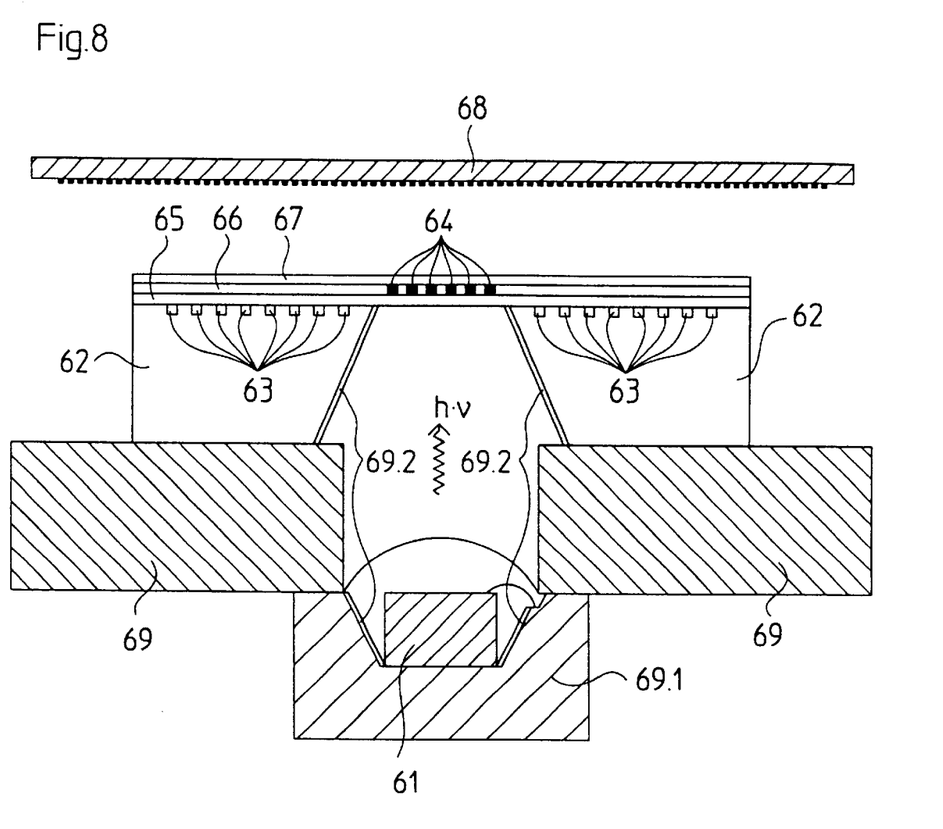
FIG. 8 shows a side elevation view of a seventh embodiment of the scanning head according to the invention.

In a further embodiment, light-emitting diode 61 is not positioned by semiconductor substrate 62 directly in the blind hole, but rather in a special cavity 69.1. This can be realized by a corresponding configuration of base plate 69. If necessary, it is sufficient to mill out the base plate in order to position light-emitting diode 61. In this manner, a conventional SMD component can be used as light-emitting diode 61. It is advantageous if, as already described, the surfaces which are not to be reached by a beam of light-emitting diode 61 are coated accordingly. If this coating 69.2 is carried out using reflecting material, it is possible not only to prevent interference currents from arising, but also to increase the light energy of light-emitting diode 61 that is emitted to transmitting grating 64.

Figure 9:
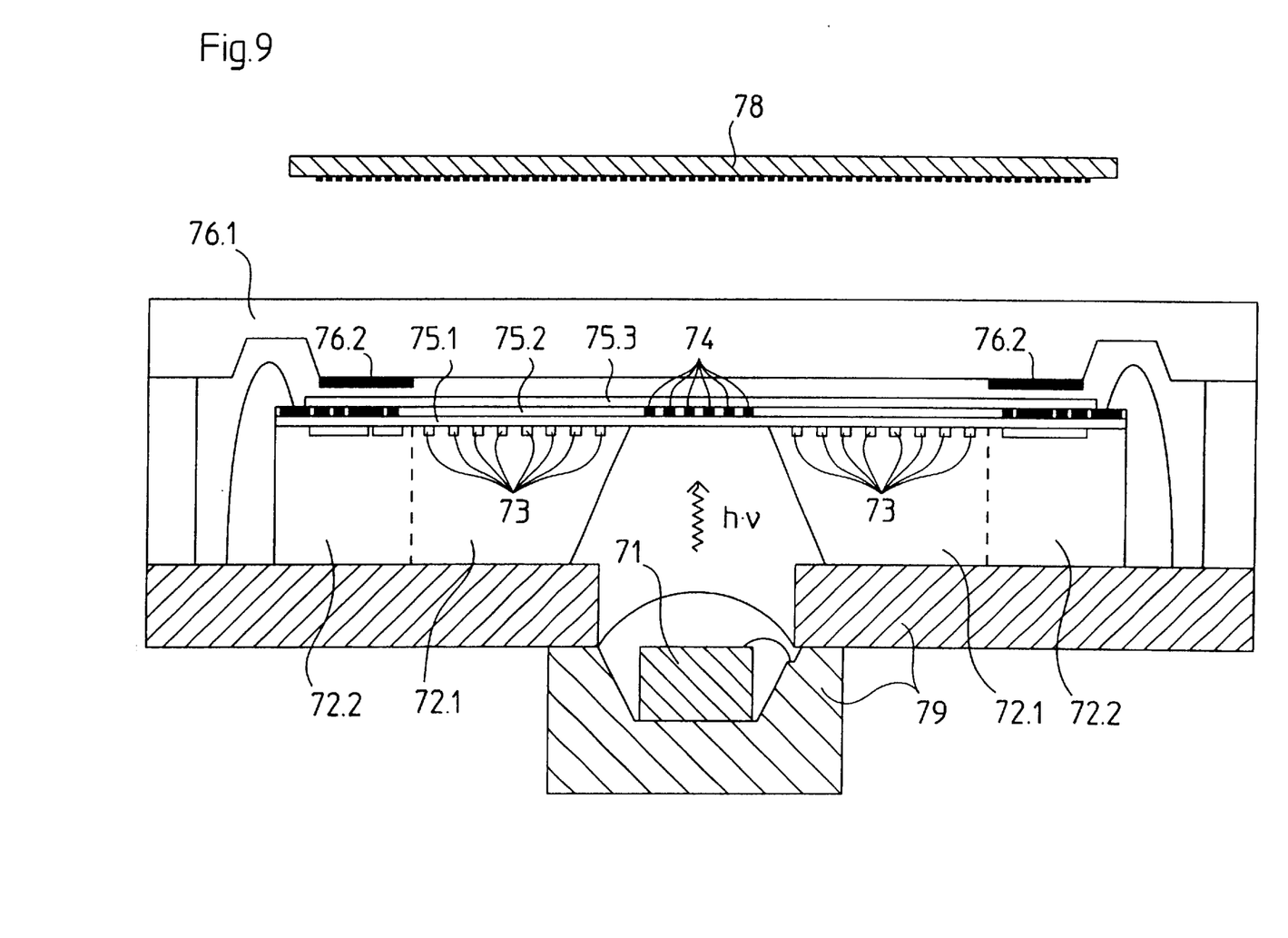
FIG. 9 shows an side elevation view of an eighth embodiment of the scanning head according to the invention.

In FIG. 9, a configuration of the scanning head according to the invention is depicted, which includes further elements, in particular used for processing the output signals of photo diodes 73. As in the preceding exemplary embodiments, a semiconductor substrate 72.1 has a blind hole, into which a light-emitting diode 71 has been placed. On the side of semiconductor substrate 72.1 facing scale 78, patterned photo diodes 73, disposed at a distance from each other corresponding to the receiving grating constants, are integrated into semiconductor substrate 72.1. An oxide layer 75.1 that is transparent for the beam of light-emitting diode 71 is applied over the side of semiconductor substrate 72.1 that is facing scale 78. Over this oxide layer 75.1, provision is made for a metallization layer 75.2, which contains a transmitting grating 74 through which the beam of light-emitting diode 71 passes and becomes patterned. Thereafter, a transparent passivation layer 75.3 follows, through which the beam also penetrates.

To protect the further assemblies on semiconductor substrate 72.2 from the beam of light-emitting diode 71 that is reflected by scale 78, and to increase the mechanical stability of transmitting grating 74, provision is made for a planar assembly between semiconductor substrate 72.1, 72.2, and scale 78. The planar assembly can be transparent in the area of transmitting grating 74 and photo diodes 73, but in the other areas can be coated so as to be non-transparent. This assembly is preferably a glass plate 76.1, which on the side facing the scanning head carries a coating 76.2 of chromium. Furthermore, glass plate 76.1 can have a pattern, so that a four-grating sensor is realized. In this way, scattered light such as the light reflected by scale 78 and also ambient light, is prevented from influencing the assemblies on adjoining semiconductor substrate 72.2. In addition, this supplemental assembly 76.1, 76.2 can also be used to contact the scanning head. For this purpose non-transparent coating 76.2 of the glass plate also includes printed circuit traces, so that a flip-chip assembly process can be used, to contact contacts 103, as depicted in FIG. 1. Transparent coating 76.2 and the printed circuit traces on glass plate 76.1 can be preferably made of the same material. The supplemental assembly can optionally be bonded using a transparent, non-curing adhesive agent.

The method steps for manufacturing the scanning head according to the invention are now described. Since a semiconductor material, preferably silicon, is used as the basic material, the method steps are related to those which are used in the manufacture of integrated circuits.

In a first step, semiconductor material of the quality necessary for the manufacture of integrated circuits, in particular with respect to purity and surface quality is provided.

Subsequently, the pn-junctions of photo diodes 3 as seen in FIG. 2, are diffused into semiconductor material 2 so that photo diodes 3 and patterned photodetectors 102 are formed. The width and the distance between photo diodes 3 is determined in accordance with the desired grating constants for the receiving grating.

In the third step, an oxide layer 5 composed of $SiO_2$ having a thickness of about 1–3 $\mu$m is formed on the side of semiconductor substrate 2 on which photo diodes 3 are located.

Subsequently, in the fourth step, a metallization layer is applied to the oxide layer. This metallization layer is processed using photochemical processes that are known from semiconductor manufacturing, so that transmitting grating 4 is formed having the desired grating constants.

Finally, in step 5, another passivation layer 7 is applied having a thickness of about 0.5–3 $\mu$m, which protects the surface and in particular gives transmitting grating 4 additional mechanical stability. This passivation layer 7 is preferably made of silicon nitride, $Si_3N_4$.

After the side of semiconductor substrate 2 facing scale 8 has been processed in this manner, the semiconductor is anisotropically etched on the reverse side in the area of transmitting grating 4, so that in that area no semiconductor substrate 2 remains. Other etching processes, such as isotropic wet etching or dry etching, can also be used.

In the seventh and final step, the semiconductor is secured to base plate 9, on which light-emitting diode 1 is already arranged.

In the exemplary embodiments according to FIGS. 3 and 7, minor discrepancies in the process inevitably arise. In the exemplary embodiment according to FIG. 3, receiving grating 14.2 is manufactured simultaneously with transmitting grating 14.1.

In the exemplary embodiment according to FIG. 7, processing steps 4 and 5 are not used. Processing step 6 is modified such that, in the anisotropic etching in the area of the side of semiconductor substrate 52 that faces scale 58, bars 52.1 still remain at a distance in accordance with the desired grating constants of the transmitting grating. The remaining processing steps are then carried out as already described.

In order to be able to increase the mechanical stability, of the device, additional transparent layers having a large thickness up to roughly 100 $\mu$m can be applied on the metallization layer or on the passivation layer. Silicon dioxide, boron phosphorous silicate glass, or sol-gels are suitable for this purpose.

The measuring system in which the scanning head according to the invention is used, can be both a uni-dimensional measuring system, such as length and angle measuring systems, as well as a two-dimensional measuring system, such as a cross-grating measuring system that uses a cross-line or checkerboard grating as a scale. The scanning system necessary for this purpose can have two scanning heads, according to the invention, that are advantageously oriented orthogonally to each other. Alternatively, two groups of photoelements having a uni-dimensional pattern can also be integrated into one scanning head, the orientation of the groups corresponding to the measuring direction or being orthogonal with respect to each other. The transmitting grating can then be configured as a two-dimensional grating, for example as a cross-line or checkerboard grating.

It will be apparent to those skilled in the art that various modifications and variations can be made in the structure and the methodology of the present invention, without departing from the spirit or scope of the invention. Thus, it is intended that the present invention cover the modifications and variations of this invention provided they come within the scope of the appended claims and their equivalents.

What is claimed is:

1. A measuring system, comprising:
   a scale which carries a graduation;
   a scanning head including:
   a semiconductor substrate having a first side facing the scale;
   a plurality of photodetectors disposed on the first side of the semiconductor substrate, the photodetectors patterned and integrated in the semiconductor substrate;
   a hole formed in the semiconductor substrate, the hole edged on the first side by a transmitting grating symmetrically aligned with respect to the photodetectors; and
   a light source disposed on a side of the transmitting grating facing away from the scale.

2. The measuring system as recited in claim 1, wherein the light source is a light-emitting diode and is divergent.

3. The measuring system as recited in claim 1, further comprising at least one transparent layer that is at least partially transparent to light from the light source, said layer being disposed on the first side of the semiconductor substrate facing the scale.

4. The measuring system as recited in claim 3, wherein the semiconductor substrate is made of silicon, and the transparent layer is made of silicon dioxide.

5. The measuring system as recited in claim 1, wherein the transmitting grating is composed of metal bars formed from a metallization layer applied to the semiconductor substrate.

6. The measuring system as recited in claim 1, further comprising a non-transparent coating that reflects light emitted by the light source, said non-transparent coating being disposed on border surfaces of the semiconductor substrate and a portion of a base plate adjacent to the hole.

7. The measuring system as recited in claim 1, wherein the plurality of patterned photodetectors comprises at least one photo diode, and wherein the plurality of patterned photodetectors are offset in relation to each other in a measuring direction by a quarter period of the receiving grating.

8. The measuring system as recited in claim 1, wherein the plurality of patterned photodetectors comprises rows of photodetectors, and the number of photodetectors in each row depends on a displacement of the photodetectors with respect to each other.

9. A scanning head for scanning a scale which carries a graduation, the scanning head comprising:
   a semiconductor substrate having a first side facing the scale;
   a plurality of patterned photodetectors disposed on the first side;
   a blind hole formed in the semiconductor substrate;
   a transmitting grating disposed on the first side facing the scale, said transmitting grating being symmetrically aligned with respect to the patterned photodetectors; and
   a light source disposed on a side of the transmitting grating facing away from the scale;
   wherein the transmitting grating is composed of bars formed from the semiconductor substrate.

10. A scanning head for scanning a scale which carries a graduation, the scanning head comprising:
    a semiconductor substrate having a first side facing the scale;
    a plurality of patterned photodetectors disposed on the first side;
    a blind hole formed in the semiconductor substrate;
    a transmitting grating disposed on the first side facing the scale, said transmitting grating being symmetrically aligned with respect to the patterned photodetectors, the transmitting grating composed of metal bars formed from a metallization layer applied to the semiconductor substrate;
    a light source disposed on a side of the transmitting grating facing away from the scale; and
    an oxide layer disposed over the metallization layer, and a passivation layer arranged over an arrangement of an oxide layer and a metallization layer.

11. The scanning head as recited in claim 10, wherein the patterned photodetectors are photo diodes having a width and a separation distance determined according to a desired grating constant of a receiving grating.

12. The scanning head as recited in claim 11, wherein the receiving grating is disposed above the photo diodes and is formed by metal bars of the metallization layer.

13. The scanning head as recited in claim 10, further comprising a plurality of optically opaque bars disposed on the oxide layer, adjacent the blind hole, said optically opaque bars having a greater pitch than a pitch of the transmitting grating.

14. The scanning head as recited in claim 10, further comprising a carrier disposed on a side of the passivation layer facing the scale, said carrier having a coating with non-transparent portions.

15. The scanning head as recited in claim 14, wherein the carrier is made of glass and the coating is made of a conductive material, and wherein the coating has electrically conductive portions.

16. A scanning head for scanning a scale which carries a graduation, the scanning head comprising:
    a semiconductor substrate having a first side facing the scale;
    a plurality of patterned photodetectors disposed on the first side;
    a blind hole formed in the semiconductor substrate;
    a transmitting grating disposed on the first side facing the scale, said transmitting grating being symmetrically aligned with respect to the patterned photodetectors;
    a light source disposed on a side of the transmitting grating facing away from the scale;
    a base plate for holding the light source, said base plate being disposed on a second side of the semiconductor substrate facing away from the scale;

an adhesive agent bonding the light source to the transmitting grating, said adhesive agent being adapted to conduct light of the light source to the transmitting grating; and an opaque filling material adapted for filling portions of the blind hole.

17. The scanning head as recited in claim 16, wherein the light source is a light-emitting diode arranged in a recess of the base plate.

18. A measuring system, comprising:

a scale which carries a graduation;

a scanning head including:
   a semiconductor substrate having a first side facing the scale;
   a plurality of photodetectors disposed on the first side of the semiconductor substrate, the photodetectors patterned and integrated in the semiconductor substrate;
   a hole formed in the semiconductor substrate, the hole edged on the first side by a transmitting grating symmetrically aligned with respect to the photodetectors; and
   a light source disposed on a side of the transmitting grating facing away from the scale;

wherein the transmitting grating is composed of bars formed from the semiconductor substrate.

19. A measuring system, comprising:

a scale which carries a graduation;

a scanning head including:
   a semiconductor substrate having a first side facing the scale;
   a plurality of photodetectors disposed on the first side of the semiconductor substrate, the photodetectors patterned and integrated in the semiconductor substrate;
   a hole formed in the semiconductor substrate, the hole edged on the first side by a transmitting grating symmetrically aligned with respect to the photodetectors, the transmitting grating composed of metal bars formed from a metallization layer applied to the semiconductor substrate;
   a light source disposed on a side of the transmitting grating facing away from the scale; and
   a passivation layer arranged over an arrangement of an oxide layer and a metallization layer.

20. The scanning head as recited in claim 19, wherein the patterned photodetectors are photo diodes having a width and a separation distance determined according to a desired grating constant of a receiving grating.

21. The measuring system as recited in claim 20, wherein the receiving grating is disposed above the photo diodes and formed by metal bars of the metallization layer.

22. The measuring system as recited in claim 20, further comprising a plurality of optically opaque bars disposed on the oxide layer, adjacent the hole, said optically opaque bars having a greater pitch than a pitch of the transmitting grating.

23. A measuring system, comprising:

a scale which carries a graduation;

a scanning head including:
   a semiconductor substrate having a first side facing the scale;
   a plurality of photodetectors disposed on the first side of the semiconductor substrate, the photodetectors patterned and integrated in the semiconductor substrate;
   a hole formed in the semiconductor substrate, the hole edged on the first side by a transmitting grating symmetrically aligned with respect to the photodetectors;
   a light source disposed on a side of the transmitting grating facing away from the scale;
   a base plate for holding the light source, said base plate being disposed on a second side of the semiconductor substrate facing away from the scale;
   an adhesive agent bonding the light source to the transmitting grating, said adhesive agent being adapted to conduct light of the light source to the transmitting grating; and
   an opaque filling material adapted for filling portions of the hole.

24. The measuring system as recited in claim 27, wherein the carrier is made of glass and the coating is made of a conductive material, and wherein the coating has electrically conductive portions.

25. The measuring system as recited in claim 19, further comprising a carrier disposed on a side of the passivation layer facing the scale, said carrier having a coating with non-transparent portions.

26. The scanning head as recited in claim 25, wherein the carrier is made of glass and the coating is made of a conductive material, and wherein the coating has electrically conductive portions.

27. The measuring system as recited in claim 19, further comprising a carrier disposed on a side of the passivation layer facing the scale, said carrier having a coating with non-transparent portions.

28. The measuring system as recited in claim 27, wherein the light source is a light-emitting diode arranged in a recess of the base plate.

* * * * *